United States Patent [19]
Pienimaa et al.

[11] Patent Number: 6,110,563
[45] Date of Patent: *Aug. 29, 2000

[54] METHOD AND ARRANGEMENT FOR ELECTROMAGNETICALLY SHIELDING AN ELECTRONIC MEANS

[75] Inventors: Seppo Pienimaa, Salo; Tapio Taka, Porvoo; Heikki Isotalo, Vantaa; Salme Jussila, Espoo; Olli Salmela, Helsinki; Henrik Stubb, Espoo, all of Finland

[73] Assignee: Nokia Mobile Phones, Ltd., Salo, Finland

[ * ] Notice: This patent issued on a continued prosecution application filed under 37 CFR 1.53(d), and is subject to the twenty year patent term provisions of 35 U.S.C. 154(a)(2).

[21] Appl. No.: 08/770,398

[22] Filed: Dec. 20, 1996

[30] Foreign Application Priority Data

Dec. 22, 1995 [FI] Finland ................... 956226

[51] Int. Cl.⁷ ................................ H05K 9/00
[52] U.S. Cl. ............... 428/137; 428/161; 428/164; 428/901; 174/35 R; 174/35 MS; 29/597.1; 29/82.5; 29/841; 427/372.2; 427/73; 427/96; 156/278
[58] Field of Search ................ 428/137, 161, 428/164, 901; 174/35 R, 35 MS; 29/592.1, 825, 841; 427/372.2, 73, 96; 156/278

[56] References Cited

U.S. PATENT DOCUMENTS

| | | | |
|---|---|---|---|
| 4,514,586 | 4/1985 | Waggoner | 174/35 MS |
| 4,912,604 | 3/1990 | Vaisanen | 361/424 |
| 4,945,633 | 8/1990 | Hakanen et al. | 29/825 |
| 5,006,667 | 4/1991 | Lonka | 174/35 R |
| 5,017,420 | 5/1991 | Marikar et al. | 428/212 |
| 5,166,864 | 11/1992 | Chitwood et al. | 361/386 |
| 5,177,324 | 1/1993 | Carr et al. | 174/35 R |
| 5,196,144 | 3/1993 | Smith et al. | 252/500 |
| 5,254,633 | 10/1993 | Han et al. | 525/327.4 |
| 5,271,056 | 12/1993 | Pesola et al. | 379/58 |
| 5,281,363 | 1/1994 | Schacklette et al. | 252/500 |
| 5,294,694 | 3/1994 | Epstein et al. | 528/210 |
| 5,365,410 | 11/1994 | Lonka | 361/816 |
| 5,400,949 | 3/1995 | Hirvonen et al. | 228/180.22 |
| 5,407,699 | 4/1995 | Myers | 427/121 |
| 5,430,073 | 7/1995 | Van Dijk et al. | 522/66 |
| 5,436,317 | 7/1995 | Jarvinen et al. | 528/422 |
| 5,442,521 | 8/1995 | Hirvonen et al. | 361/800 |
| 5,463,014 | 10/1995 | Epstein et al. | 528/210 |
| 5,557,064 | 9/1996 | Isern-Flecha et al. | 174/35 MS |
| 5,603,103 | 2/1997 | Halttunen et al. | 455/90 |
| 5,687,470 | 11/1997 | Halttunen et al. | 29/592.1 |
| 5,742,488 | 4/1998 | Lonka et al. | 361/816 |
| 5,844,166 | 12/1998 | Halttunen et al. | 174/35 R |
| 5,895,884 | 4/1999 | Davidson | 174/35 R |
| 5,917,710 | 6/1999 | Muatta | 361/818 |

FOREIGN PATENT DOCUMENTS

| | | |
|---|---|---|
| 0 522 538 | 1/1993 | European Pat. Off. . |
| 40 16 953 | 11/1991 | Germany . |
| 462 944 | 9/1990 | Sweden . |
| WO 95/28822 | 10/1995 | WIPO . |

OTHER PUBLICATIONS

"EMC for Product Designers" Williams, Butterworth–Heinemann Ltd. 1992, 255 pp.

*Primary Examiner*—William P. Watkins, III
*Attorney, Agent, or Firm*—Perman & Green, LLP

[57] ABSTRACT

The invention relates to a method and an arrangement for shielding an electronic means (40, 41) against external electromagnetic interference on one hand, and preventing the electronic means from interfering with closeby electric devices on the other hand. According to the invention, a shielding film (42, 43) with one or more layers is formed comprising one or more intrinsically conductive polymer films (43) and one or more insulating films (42). The shielding film (42, 43) so formed is attached to the surface of the electronic means (40, 41) using a heat treatment or a vacuum treatment or the combination of the two and, if necessary, a separate layer of glue. The invention also relates to a method for electrically connecting (44, 45, 46, 47) the intrinsic polymer layer (43) reliably to the electronic means (40, 41). The invention further relates to a method for using the electromagnetic shield to form capacitors and resistors for the electronic means.

21 Claims, 2 Drawing Sheets

METHOD AND ARRANGEMENT FOR ELECTROMAGNETICALLY SHIELDING AN ELECTRONIC MEANS

BACKGROUND OF THE INVENTION

The invention relates to a method for shielding an electronic means against external electromagnetic radiation on one hand, and preventing the electromagnetic radiation of the electronic means from interfering with closeby apparatuses on the other hand. The electronic means may be an electronic apparatus, for example, or a unit, such as a printed circuit board assembly, in an electronic apparatus.

Electromagnetic interference (EMI) shielding of electric equipment is traditionally based on the use of either metal equipment cases or plastic cases coated with a metal layer. In addition, methods are known for manufacturing cases of a conductive plastic composite where conductive particles, such as carbon black, carbon fibres, metal fibres or metal flakes are mixed with the insulating plastic.

Disadvantages of a metal case include its weight and the high price caused by numerous machining steps. Also the coating of a plastic case with a metal layer includes many steps and is therefore uneconomic. The disadvantage of methods based on conductive plastic composites is uneven distribution of conductive particles which leaves unshielded spots in the case. Furthermore, in all the above methods it is difficult to make the EMI shielding tight because of holes and joints in the case.

At the printed circuit board (PCB) level, the EMI shielding is usually realised by a multilayer PCB (internal ground layers) or by a polymer composite containing conductive metal particles and spread by means of silk screen printing. Reference [1] discloses such a method based on a polymer composite which, however, is restricted only to shield wirings on a PCB. Since components and their coupling areas constitute a great part of the area of an electronic means, the shielding provided by this method is insufficient. Nor does a multilayer PCB shield the whole electronic means and the surface-mounted or other components on it.

Reference [2] discloses a method in which a non-conductive substrate material is coated using a chemical copper plating method. In the method, the part to be coated is submerged in a chemical bath, so usually the method cannot be applied to an electronic means because it might cause damage to the components and because the metal coating might cause a short circuit.

Reference [3] discloses a method in which the conductive shell (metal, for example) of a component is coupled to the ground plane of the equipment case. Then, separate shielding cases must be provided for the components and, in addition, the inner surface of the equipment case must be provided with a conductive layer. The extra cost of this method caused by the many steps is too high for the manufacturing of most electronic devices.

In addition, a method is known from reference [4], wherein conductive polyaniline is used to absorb electromagnetic radiation. The absorber can be used for electromagnetic absorption in the IR, visible light, UV, radar or microwave range. However, said patent document discloses no technical implementation for the EMI shielding of an electronic means.

An object of the invention is to eliminate the disadvantages of known EMI shielding methods by providing a new kind of method for the EMI shielding of an electronic means. In the method according to the invention, electromagnetic shielding is produced using a conductive film material placed near the surface of an electronic means. The conductive film is isolated from the electronic means by an insulator film. By using e.g. an intrinsically conductive polymer (ICP) such as polyaniline according to the invention, known solutions and methods can be implemented more advantageously and near to the surface of the electronic means. The method is not only an economic but also a quick way of shielding an electronic means. The method is also suitable for an electronic assembly where the coupling regions of components are unshielded because the insulator film prevents short-circuits. Another object of the invention is to provide a method for electrically connecting a conductive film material to an electronic means, advantageously to its ground potential. The inventive solution can also be used for forming capacitors and resistors for the circuits of electronic means.

The method according to the invention is characterized in that said electronic means is coated with an electrically insulating material and said insulating material is coated with an electrically conductive material. The arrangement according to the invention is characterized in that it comprises at least one electrically conductive film to shield against electromagnetic radiation and at least one electrically insulating film to insulate said electrically conductive film from electrically conductive parts in the electronic means.

BRIEF DESCRIPTION OF THE DRAWINGS

The invention is described with reference to the accompanying drawing, where.

DETAILED DESCRIPTION OF THE PREFERRED EMBODIMENTS

Figure 1:
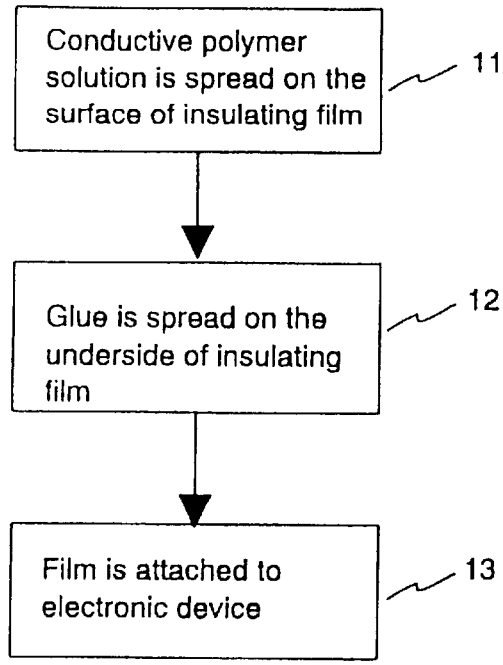
FIG. 1 shows in flow chart format the manufacturing steps of a shielding method according to the invention.

We will next discuss the EMI shielding characteristics of the conductive film used in the invention in order to illustrate the operating principles of the invention. Then we will disclose in more detail a shielding method according to the invention by means of FIGS. 1 and 2, and a shielding arrangement according to the invention by means of FIG. 3. Finally, we will disclose an implementation according to the invention to ground an EMI shield, referring to FIG. 4.

The EMI shielding capability of an intrinsically conductive polymer film and other films made of a conductive material is based on the fact that electromagnetic radiation is reflected from a conductive surface while the proportion of absorption losses and losses caused by multiple reflections within the material is small. The most significant parameters in estimating the shielding capability are the conductivity a and thickness d of the conductive coating, frequency f of the interfering radiation, and the distance r between the interfering source and the shielding layer which determines whether we are dealing with a near field or with a far field. One quantity that is frequently used in estimating the shielding capability in a far field is the depth of penetration δ, which describes the distance in the shielding layer in which the intensity of interfering electromagnetic radiation is attenuated to the $1/e^{th}$ part of the original value. The shielding effect is discussed in further detail in document [6] which contains the formula $$\delta = \frac{1}{\sqrt{\pi f \mu \sigma}} \quad (1)$$

according to which the depth of penetration depends on the conductivity σ of the material, permeability μ and radiation frequency f. The shielding material is deemed electrically thin if d<<δ, and electrically thick if d>>δ. Conductivities of conductive polymers vary in the range of 1 to 100 S/cm, which means that δ≧159 μm when the frequency is in the range of 10 MHz to 1 GHz, and thus, e.g. centrifugally spread conductive polymer films are clearly thin.

A formula [6] has been proven for reflection losses $R_e$ in an electric near field:

$$R_e = 322 + 10 \log \frac{\sigma_r}{r^2 f^3 \mu_r} \text{ dB}, \quad (2)$$

where $\sigma_r$ is the conductivity scaled with respect to copper, r is the distance from the interfering source, f is the frequency and $\mu_r$ is the relative permeability. According to the formula, reflection increases as conductivity is increased and decreases as frequency and distance are increased. The short distance between the conductive layer and the interfering source, which is characteristic of the method according to the invention, is a significant advantage in the attenuation of interference caused by an electronic means.

In the method and arrangement according to the invention, the conductive film is advantageously made of an intrinsically conductive polymer. The basic method to make the polymer conductive is similar to that used for traditional semiconductors, i.e. doping. The impurity molecules or atoms added to the polymer enable hole conduction or electron conduction.

The impurity ion attached to the polymer chain in the doping process causes a little but significant change in the relationship between the polymer chain atoms. This change facilitates the generation of different types of defects for example solitons, Polaroid and bipolarons and they are formed near the impurity ions. So, the doping mechanisms for traditional semiconductors and for conductive polymers on the other hand are clearly different in that in the case of conductive polymers the impurity molecules never replace the atoms in the polymer chain like in the case of silicon doping, for example, but bound adjacent to the chains they act as donors or acceptors of electrons.

The most extensively studied conductive polymer materials have been polyacetylene, polytiophene, polypyrrole, polyparaphenylene, polyaniline and their modifications. Polyaniline is of special interest because it has good stability characteristics combined to a relatively high conductivity level. Polyaniline can also be solution processed in conductive state without substantially changing the structure and conduction capability of the polymer. Polyaniline is further discussed in reference [5].

The conductive polymer film used in connection with the method according to the invention maybe e.g.

polyaniline which is doped through protonation using a functional protonic acid, such as dodecyl benzene sulphonic acid (DBSA) or camphor sulphonic acid (CSA), thereby improving the solubility of the conductive polymer in some organic solvents (e.g. PANI/CSA dissolves in m-cresol), and in the case of PANI/DBSA it is possible to make conductive blends in which polyaniline is the conductive constituent, solution-mouldable polyalkyltiophene which is post-doped or polypyrrole manufactured through chemical polymerization.

The insulating film used in the method according to the invention advantageously meets the following requirements:

the insulating film together with the conductive polymer film layer is topographically moulded on the surface of the electronic means, the insulating film is a good electrical insulator, the insulating film has a good solvent resistance if the conductive polymer solution is spread on the surface of the insulating film, the conductive polymer adheres well to the insulating film, and the insulating film stands manufacturing and coupling stages and retains its characteristics in the operating conditions of the electronic means.

In practice, the thickness of the insulating film may be about 20 to 300 μm, but to make the handling of the film easier the thickness is advantageously 50 to 150 μm.

Insulating film materials that meet the above requirements include polycarbonate (manufactured by BAYER/Makrofol), polyurethane Walopur® (manufactured by Wolff Walsrode AG) and polyvinyl fluoride Tedlar® (manufactured by Du Pont).

FIG. 1 illustrates a method according to the invention for implementing EMI shielding. The conductive layer in the conductive polymer/insulating film combination according to the method is a PANI/CSA film manufactured by dissolving PANI/CSA in m-cresol. The conductive film is produced on top of the insulating film e.g. as follows: a drop of liquid conductive material is placed on the centre of the insulating film which is rapidly spinned whereupon the conductive material is spread by the centrifugal force on the surface of the insulating film thus forming a conductive material film, block 11. This method is called centrifugal spreading, or spinning. The revolution speed used in spinning is typically 1000 to 2000 rpm. The thickness of a spinned PANI/CSA film is approximately 1 μm and the conductivity is 100 S/cm, approximately. Spraying and dipping are methods suitable for large areas and applicable as continuous processes. In these methods, a conductive polymer dissolved in a suitable solvent, such as m-cresol, is spread on the surface of the insulating layer.

The insulating film is advantageously one of the flexible plastic films mentioned above having good electrical insulating properties and at the same time good solvent resistance. After the formation of the conductive polymer layer glue is spread, if necessary, on the surface of the insulating film to attach the film to the electronic means unless the insulating film is already coated with glue, block 12. The conductive layer may also be under the insulating film so that glue is spread on top of it. This structure can be used when the areas to be shielded in the electronic means are insulating. The advantage of this structure is that the conductive layer is protected against the environment. A corresponding protection layer can be used in other film combinations, too, if necessary.

The resulting combination of conductive and insulating film is attached to the electronic means advantageously using heat and low-pressure treatment, block 13. In the treatment, the film is placed on top of the electronic means and heated in order to make it mouldable. At the same time, a vacuum is produced below the film, whereby the film is pressed against the surface of the electronic means and is moulded, where necessary, to topographically follow the contours of the surface of the electronic means. Due to the simultaneous heat and vacuum treatment the film is shaped and attached, by means of the glue spread on the insulating film, to the surface of the electronic means. The glue is advantageously elastic so that temperature changes will not result in tension between the film and the electronic means. The insulating film may also be made of plastic that shrinks when heated, such as polyethene. Such a tube-like film is suitable for shielding equipment, connections and cables in the manner of a shrink sleeve.

Figure 2:
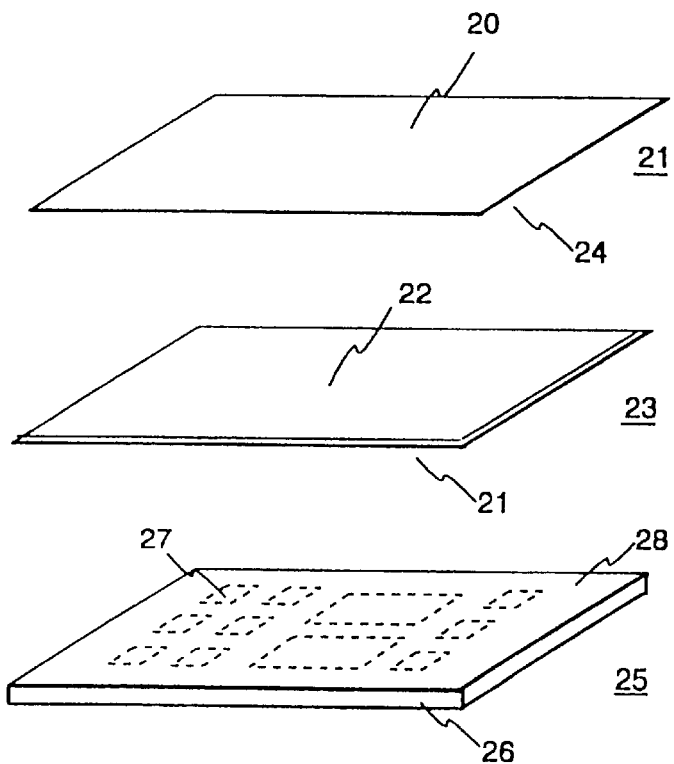
FIG. 2 shows the shielding films after the manufacturing steps according to FIG. 1.

FIG. 2 shows the shielding structure in different phases of the method illustrated in FIG. 1. Film 21 consists of an insulating film 20 which has a layer of glue 24 on its underside. Film 23 includes a conductive film 22 spread on top of film 21 mentioned above. Finally, the resulting film 28 is attached onto the surface of an electronic means comprising a printed circuit board 26 and components 27 inserted on the printed circuit board.

Another conductive film material that can be used in the arrangement according to the invention is PANI/DBSA. PANI/DBSA is solidified in about 200° C. into a solid film which can be hot-moulded in about 100° C. so as to form a combination with an insulating film. This method has the advantage that the insulating film need not be capable of standing the 200° C. temperature of the solidifying process. The thickness of a solidified PANI/DBSA film is ~70 $\mu$m and conductivity ~2 S/cm. The PANI/DBSA film can also be made of a PANI+DBSA blend using extrusion moulding.

Figure 3:
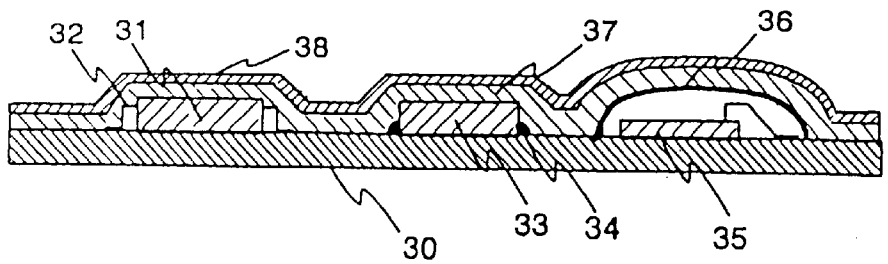
FIG. 3 is a cross section of a shielding arrangement according to the invention for a printed circuit board assembly and FIG. 4 is a cross section of conductive film grounding arrangements according to the invention.

FIG. 3 shows a shielding arrangement according to the invention in which a PANI/CSA film 38 has been spin-coated on a 100-$\mu$m polycarbonate film 37. This two-layer film has been attached onto the surface of an electronic means by means of vacuum or heat treatment or the combination of the two. Please notice that in order to better illustrate the film structures the films in FIG. 3 are shown thicker than they really are with respect to the electronic means and the components inserted in it. For the attachment by low-pressure to be successful the layers in the film must be capable of moulding themselves according to the surface topography of the device shielded. As in the case above, the PANI/CSA insulating film combination can be attached with a separate layer of glue (not shown) to the surface of the electronic means. The electronic means shown in FIG. 3 comprises a printed circuit board 30 with wired 32 components 31, surface-mounted 34 components 33, and encapsulated 36 components 35.

The method of the invention can also be used to produce a multilayer structure in which the conductive polymer and insulating film layers alternate. The advantage of the multilayer structure is a better shielding efficiency, a limiting factor is possibly poorer mouldability as the thickness grows.

It is conceivable that in addition to the manufacturing methods described above the film could be placed on the surface of the insulating film by means of silk screen printing technology.

For the conductive polymer layer to serve as an effective EMI shield it must be electrically connected to the electronic means, advantageously to a constant potential, such as the ground plane, in the electronic means. The most important requirement for a reliable electric contact is its ohmic quality, in other words the contact resistance must be small in comparison with the resistance of the conductive polymer film and the metal-polymer junction must not restrict the flow of current. In principle, the coupling type is determined on the basis of the work functions ($\phi_m$, $\phi_p$) of the material used for contacting and the conductive polymer film in a manner such that metals like aluminium and indium that have a small work function ($e\phi_{Al}\approx4.2$ eV, $e\phi_{In}\approx4.1$ eV) form a rectifying contact, and metals like gold ($e\phi_{Au}\approx5.3$ eV) and graphite ($e\phi_m\approx5.5$ eV) that have a high work function form an ohmic contact usually in a p-type conductive polymer film. Metals that have a high work function also have the advantage that they are not easily oxidized and so the contact is more stable.

In the implementation method discussed in this invention the contacting materials are graphite paste and silver paint ($e\phi_{Ag}4.6$ eV) which do not require heat treatment in order to dry up and do not contain solvents detrimental to the conductive polymer film.

Figure 4:
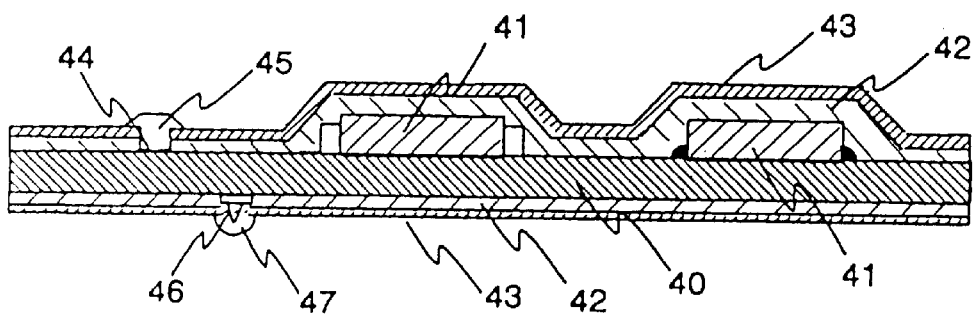

FIG. 4 shows two embodiments according to the invention for electrically connecting a conductive polymer layer to the ground potential of a printed circuit board assembly serving as an electronic means. In the first embodiment there is on the surface of a multilayer printed circuit board 40 a conductor area 44 coupled to the ground potential plane in the middle of the multilayer printed circuit board by means of a lead-through (not shown), for example. When the combination of the insulating film 42 and conductive film 43 has been attached to the surface of the printed circuit board assembly 40, 41, a hole is made in the films at said conductor area by means of a laser, for example. The hole is completely or in part filled with a conductive layer 45 consisting of a drop or sprayed intrinsically conductive polymer, a graphite paste or a polymer containing silver.

In the second embodiment a projection 46, which may be a sharp spike, is attached perpendicularly to the printed circuit board to the grounding point. As the shielding film is attached the spikes penetrate the shielding film 42, 43 and extend through the conductive polymer film. Then the conductive polymer 43 is electrically connected by means of a conductive substance 47, such as a graphite paste or a polymer containing silver, to said spikes at and around the edges of the hole formed in the penetration. When using this grounding method one must bear in mind that the grounding spikes must not penetrate the films during the vacuum treatment because then the attachment of the film would be incomplete. Therefore, with this grounding method it is advantageous to use mechanical pressing instead of the vacuum treatment to attach the film.

With the multilayer structure it is advantageous to connect all the conductive planes of the structure to the ground potential by means of a conductive contact. This can be arranged using the grounding methods described above in a manner such that the conductive substance 45 forms a contact with the edges of the conductive planes in the hole.

Another embodiment of the invention comprises a method where a shielding film is first attached to the surface of an electronic means using e.g. a method described above and then a conductive film is sprayed on the surface or areas where there are holes formed in the insulating film for ground connections to the printed circuit board.

Figure 5:
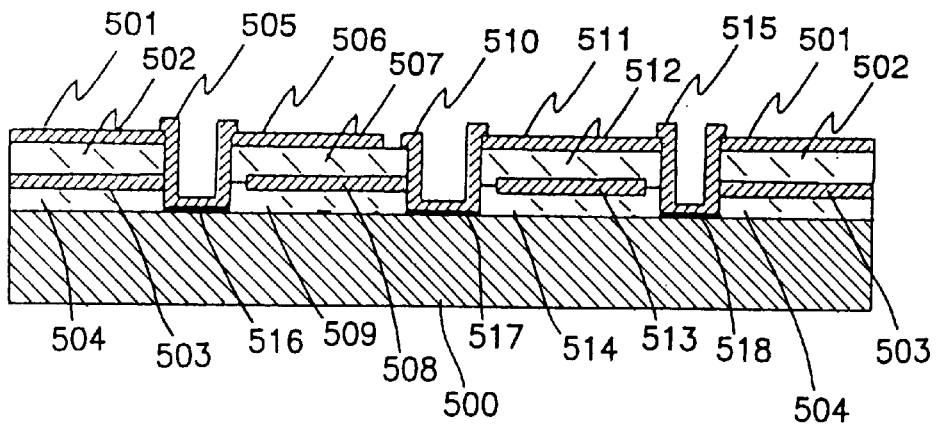
FIG. 5 is a cross section of a shielding arrangement according to the invention where the shield is also used for forming a capacitor and a resistor.

FIG. 5 shows a cross section of a shielding arrangement according to the invention where the shield is also used for forming a capacitor and a resistor. There is a shield with two layers of dielectric insulating film 502, 504 and two layers of conductive film 501, 503 on a printed circuit board 500. The conductive films are connected electrically to grounding pads 516 and 518 with electrical connections 505 and 515.

There are two areas that are separated from the shielding film. The first area consists of insulating film areas 507 and 509 and conductive film areas 506, 508. The first conductive film area 506 is connected electrically to a ground contact pad 516 with an electrical connection 505. The second conductive film area 508 is connected electrically to a signal pad 517 with an electrical connection 510, thus the capacitance that is formed between the conductive film areas 506 and 508 forms a capacitor between the ground pad 516 and the signal pad 517. The electrical connections between film areas and pads are preferably made by applying intrinsically conductive polymer to the edges of cut lines or holes. The conductive film areas 506 and 508 are formed by e.g. laser or acid treatment in such a way that there will be no electrical short circuit from a conductive film area to the opposite electrical connection of the formed capacitor.

The second separated area consists of conductive films 511, 512 and insulating films 512, 514. The first conductive film area 511 is connected to the signal pad 517 and grounding pad 518 from its ends. Thus there is a resistor formed between the two pads. The resistance of the resistor can be adjusted to a suitable value by forming the conductive film area into a defined pattern with laser or acid pen. This is due to the fact that applying heat and acid to the conductive film reduces or destroys its conductivity. The second conductive film area 513 is isolated from both electrical contacts, so it does not affect the resistivity of the resistor. A resistor can thus also be made with a shield that has only one conductive film layer.

As was stated earlier, the shielding methods according to the invention have several advantages over the known methods. The method requires only a few steps and the necessary steps can be made automatic so that the costs of shielding remain low. In addition, the shielding is tight since the shield is continuous and has no holes or openable joints. Furthermore, a thin film does not substantially reduce heat conduction from the electronic means.

By means of the manufacturing methods described above the shielding film can be made transparent or translucent whereby it is possible to see the components of the electronic means and their markings through the shielding film. Therefore, the method can be applied to electronic means that contain display components such as light-emitting diodes indicating operational status, for example.

The method and arrangement according to the invention can be advantageously applied to electronic means, such as printed circuit board assemblies, where the differences in surface height are a few millimetres at the most. If the differences in height are considerable, the film will stretch at such locations and the shielding effect of the film will be reduced.

The most advantageous EMI shielding method according to the invention is one where the highest operating frequencies of the electronic means to be shielded are 100 MHz to 1 GHz at the most. Then the film will act as an effective EMI shield.

The invention described above can be advantageously applied to various electronic means whose electromagnetic radiation may interfere with other electronic means or whose operation may be disturbed by electromagnetic radiation from the environment. Applicable devices include telecommunication terminals, such as mobile stations, and computer equipment and measuring instruments.

Above it was described a few embodiments of the method according to the invention. Naturally, the principle according to the invention can be modified within the scope of the claims e.g. as regards implementation details and fields of use. Especially, the values mentioned in the descriptions of the embodiments of the invention are given as examples only.

References

[1] Carr, J. D., Hertz, A. D. and Tribbey, D. A., In situ RF shield for printed circuit board, U.S. Pat. No. 5,177,324

[2] Waggoner, J., Method of using a shielding means to attenuate electromagnetic radiation in the radio frequency range, U.S. Pat. No. 4,514,586

[3] Yokoyama, Y., Portable radio communication apparatus unnecessitating shielding case, EP 0 522 538

[4] Espstein et al., Electromagnetic radiation absorbers and modulators comprising polyaniline, U.S. Pat. No. 5,294,694

[5] Andreatta, A. et al., Electrically conductive polyaniline, U.S. Pat. No. 5,196,144

[6] Williams, T., EMC for Product Designers, Butterworth-Heinemann Ltd. 1992, 255 pp.

What is claimed is:

1. A method of providing electromagnetic shielding for an electronic means (26, 40, 41), characterized in that said electronic means is coated with electrically insulating film (21,42) and said electrically insulating film is coated with an intrinsically electronically conductive unblended polymer film (22,43), wherein the intrinsically electrically conductive film is made to have such a thickness that the shielding effect is substantially based on reflection.

2. The method of claim 1, characterized in that a liquid conductive material (22) is spread by spinning, spraying or dipping onto the surface of said electrically insulating film (21) in order to produce said electrically conductive film.

3. The method of claim 1, characterized in that said conductive film material (22) is an intrinsic PANI/CSA polymer film.

4. The method of claim 1, characterized in that a liquid conductive material is solidified into a solid conductive film which is attached to an insulating film using hot moulding.

5. The method of claim 4, characterized in that said conductive film material (43) is an intrinsic polymer film consisting of Polyaniline/Dodecyl Benzene Sulphionic Acid.

6. The method of claim 1, characterized in that said insulating film material (20, 42) is a polycarbonate, polyurethane or polyvinyl fluoride.

7. The method of claim 1, characterized in that to attach said insulating film (20, 42) to the surface of an electronic device said insulating film material is coated with glue, thermally treated and vacuum treated.

8. The method of claim 1, characterized in that said conductive film (43) is electrically connected to said electronic means (40, 41).

9. The method of claim 8, characterized in that to electrically connect the conductive film (43) to the electronic means (40, 41)

a conductor area (44) is formed on the surface of the electronic means, a hole is made at said conductor area (44) in the shielding film comprising one or more insulating films (42) and one or more conductive films (43), and the conductive film or films are connected through said hole to the conductor area (44) by means of an electrically conductive substance (45).

10. The method of claim 8, characterized in that to connect the conductive film to the electronic means (40, 41)

the electronic means is provided with an electrically conductive projection (46) perpendicular to the surface of the electronic means, said insulating film (42) and conductive film (43) are attached to the surface of the electronic means in a manner such that said projection (46) penetrates said films and said projection (46) is connected to the conductive film (43) through an electrically conductive substance (47).

11. The method of claim 9, characterized in that said electrically conductive substance (47) is an intrinsically conductive polymer, a graphite paste or a polymer containing silver.

12. An arrangement for electromagnetically shielding an electronic means (40, 41), characterized in that it comprises at least one electrically conductive unblended doped polymer film (43) to shield against electromagnetic radiation and at least one electrically insulating film (42) to insulate said electrically conductive film (43) from the electrically conductive parts in the electronic means and, wherein the at least one electrically conductive layer is made to have such a thickness that, the shielding effect is substantially based on reflection.

13. The arrangement of claim 12, characterized in that said insulating film (42) is attached to the surface of said electronic means and said conductive film (43) is attached to the surface of said insulating film (42).

14. The arrangement of claim 12, characterized in that said conductive film (43) is an intrinsically conductive polymer film.

15. The arrangement of claim 12, characterized in that the arrangement comprises means to electrically connect said conductive film (43) to said electronic means (40, 41).

16. The arrangement of claim 15, characterized in that said means for the electric connection comprises a conductor area (44) on the surface of the electronic means, an insulating film (42) and a conductive film (43) attached to the surface of the electronic means, which have a hole at said conductor area (44), and a conductive substance (45) which electrically connects the edge of the hole in the conductive film to said conductor area (44).

17. The arrangement of claim 12, characterized in that the arrangement comprises at least two insulator films and at least two conductive films which form a layered structure in which said insulator films and said conductive films alternate.

18. The arrangement of claim 17, characterized in that the arrangement comprises two electrically separated areas (506, 507) of conductive film at the opposite surfaces of the insulator film, and said conductive areas are connected electrically to said electronic means to form a capacitor in an electronic circuit.

19. The arrangement of claim 12, characterized in that the arrangement comprises an electrically separated area (511) of conductive film, and two points of said conductive area are connected electrically to said electronic means to form a resistor.

20. A method of providing electromagnetic shielding for an electronic means (26, 40, 41), characterized in that said electronic means is coated with an electrically insulating film (21, 42) and said electrically insulating film is coated with an electrically conductive unblended polymer film (22, 43), wherein the electrically conductive film has a conductivity in the range of 1–100 S/cm and a thickness of less than 159 µm.

21. An apparatus for providing electromagnetic shielding for an electronic means (26, 40, 41), characterized in that said electronic means is coated with an electrically insulating film (21, 42) and said electrically insulating film is coated with an electrically conductive unblended polymer film (22, 43), wherein the electrically conductive film has a conductivity in the range of 1–100 S/cm and a thickness of less than 159 µm.

* * * * *